(12) United States Patent
Oh et al.

(10) Patent No.: US 11,693,287 B2
(45) Date of Patent: Jul. 4, 2023

(54) CHIP ON FILM, DISPLAY DEVICE, METHOD OF FABRICATING CHIP ON FILM, APPARATUS FOR FABRICATING CHIP ON FILM

(71) Applicant: Samsung Display Co., LTD., Yongin-si (KR)

(72) Inventors: Myong Soo Oh, Asan-si (KR); Jun O Song, Jangsu-gun (KR); Seung Ho Choi, Cheonan-si (KR)

(73) Assignee: Samsung Display Co., LTD., Yongin-si (KR)

( * ) Notice: Subject to any disclaimer, the term of this patent is extended or adjusted under 35 U.S.C. 154(b) by 98 days.

(21) Appl. No.: 17/198,284

(22) Filed: Mar. 11, 2021

(65) Prior Publication Data

US 2021/0382364 A1    Dec. 9, 2021

(30) Foreign Application Priority Data

Jun. 8, 2020    (KR) .................. 10-2020-0069111

(51) Int. Cl.
| | |
|---|---|
| *G02F 1/1362* | (2006.01) |
| *H01L 23/495* | (2006.01) |
| *G02F 1/1345* | (2006.01) |
| *H01L 23/498* | (2006.01) |
| *H05K 1/18* | (2006.01) |

(52) U.S. Cl.
CPC .... *G02F 1/136295* (2021.01); *G02F 1/13452* (2013.01); *H01L 23/4952* (2013.01); *H01L 23/4985* (2013.01); *H05K 1/189* (2013.01); *H05K 2201/09736* (2013.01); *H05K 2201/10681* (2013.01)

(58) Field of Classification Search
CPC ......... H05K 2201/10681; H05K 1/189; H05K 13/0417; H05K 2203/1545; H05K 3/0052; H05K 2203/0228; H01L 23/4985
See application file for complete search history.

(56) References Cited

U.S. PATENT DOCUMENTS

| | | | |
|---|---|---|---|
| 10,283,424 B1* | 5/2019 | Chen | ....................... H01L 21/78 |
| 2006/0290463 A1* | 12/2006 | Bingham | ............... H05K 1/162 |
| | | | 338/195 |
| 2008/0119061 A1 | 5/2008 | Hwang et al. | |
| 2011/0049514 A1* | 3/2011 | Sasaki | ............... H01L 23/49572 |
| | | | 257/E23.06 |
| 2011/0300307 A1* | 12/2011 | Nakai | .................... B23K 26/40 |
| | | | 427/554 |

(Continued)

FOREIGN PATENT DOCUMENTS

| | | |
|---|---|---|
| KR | 1999-0070186 | 9/1999 |
| KR | 2008-0046021 | 5/2008 |
| KR | 2018-0070919 | 6/2018 |

*Primary Examiner* — Alexander P Gross
(74) *Attorney, Agent, or Firm* — H.C. Park & Associates, PLC

(57) ABSTRACT

A chip on film for a display device, the chip on film includes: a base substrate; a lead wire disposed on the base substrate; and a driving chip connected to the lead wire, wherein the lead wire includes: a first lead part having a first thickness; and a second lead part disposed between the first lead part and the driving chip and having a second thickness greater than the first thickness, the second lead part being connected to the driving chip. The first lead part and the second lead part include a same material.

17 Claims, 21 Drawing Sheets

(56) References Cited

U.S. PATENT DOCUMENTS

| | | | | |
|---|---|---|---|---|
| 2012/0021600 A1* | 1/2012 | Han | ................... | H01L 23/4985 |
| | | | | 438/618 |
| 2014/0369009 A1* | 12/2014 | Cho | ................... | G02F 1/13452 |
| | | | | 361/749 |
| 2020/0243474 A1* | 7/2020 | Jung | ................ | H01L 21/76865 |

* cited by examiner

CHIP ON FILM, DISPLAY DEVICE, METHOD OF FABRICATING CHIP ON FILM, APPARATUS FOR FABRICATING CHIP ON FILM

CROSS-REFERENCE TO RELATED APPLICATION

This application claims priority from and the benefit of Korean Patent Application No. 10-2020-0069111 filed on Jun. 8, 2020 which is hereby incorporated by reference for all purposes as if fully set forth herein.

BACKGROUND

Field

Implementations of the invention relate generally to a display device and, more specifically, to a chip on film including lead wires, a display device having the chip on film, a method of fabricating the chip on film, and an apparatus for fabricating the chip on film.

Discussion of the Background

A liquid crystal display device, which is one of the most commonly used display devices, includes two substrates on which field generating electrodes such as a pixel electrode and a common electrode are formed, and a liquid crystal layer disposed therebetween. The liquid crystal display device displays an image in such a manner that a voltage is applied to the field generating electrodes to generate an electric field across a liquid crystal layer, and liquid crystal molecules in the liquid crystal layer are aligned by the electric field so as to control the polarization of incident light.

Among liquid crystal display devices, a vertically aligned mode liquid crystal display device, in which liquid crystal molecules are arranged such that their long axes are perpendicular to upper and lower display panels in a state where no electric field is applied, is attracting attention because of its high contrast ratio and easy implementation of a wide reference viewing angle.

The above information disclosed in this Background section is only for understanding of the background of the inventive concepts, and, therefore, it may contain information that does not constitute prior art.

SUMMARY

Chip on films and display devices having the chip on films constructed according to the principles and exemplary implementations of the invention are capable of preventing a short circuit between lead wires since each of the lead wires including a first lead part having a first thickness and a second lead part having a second thickness greater than the first thickness.

Methods of fabricating the chip on film according to the principles and exemplary implementations of the invention are capable of fabricating a chip on film in which a short circuit between lead wires is prevented.

Apparatus for fabricating the chip on film constructed according to the principles and exemplary implementations of the invention are capable of fabricating a chip on film in which a short circuit between lead wires is prevented.

Additional features of the inventive concepts will be set forth in the description which follows, and in part will be apparent from the description, or may be learned by practice of the inventive concepts.

According to an aspect of the invention, a chip on film for a display device, the chip on film includes a base substrate; a lead wire disposed on the base substrate; and a driving chip connected to the lead wire, wherein the lead wire includes: a first lead part having a first thickness; and a second lead part disposed between the first lead part and the driving chip and having a second thickness greater than the first thickness, the second lead part being connected to the driving chip. The first lead part and the second lead part include a same material.

An end of the first lead part may be aligned with an end of the base substrate.

The first lead part may extend along a first direction from the second lead part, the lead wire may include a plurality of lead wires, and the plurality of lead wires may be arranged along a second direction crossing the first direction.

The second lead part may include a bent portion and the second lead part may extend from a portion connected to the driving chip along the first direction and one direction crossing the second direction, and then may extend from the bent portion along the first direction.

The first thickness may have a value of about 80% or less of the second thickness.

A surface of the first lead part may include a carbonized surface.

A surface of the first lead part may include surface irregularities, and a roughness of the surface of the first lead part may be greater than a roughness of the surface of the second lead part.

One surface of the base substrate may include a first base surface disposed to overlap the first lead part, and a second base surface between the adjacent first lead parts, the second base surface may include a first sub-base surface spaced apart from the first base surface, and a second sub-base surface located between the first sub-base surface and the first base surface, and the second sub-base surface may include a carbonized surface.

A surface of the base substrate may include a first base surface overlapping the first lead part, and a second base surface between the adjacent first lead parts, the second base surface may include a first sub-base surface spaced apart from the first base surface, and a second sub-base surface located between the first sub-base surface and the first base surface, the second sub-base surface may include surface irregularities, and a roughness of the second sub-base surface may be greater than each of a roughness of the first base surface and a roughness of the first sub-base surface.

The base substrate may include a first base part overlapping the first lead part, and a second base part between the adjacent first lead parts, the second base part may include a first sub-base part spaced apart from the first base part, and a second sub-base part located between the first sub-base part and the first base part, and a thickness of the second sub-base part may be smaller than each of a thickness of the first base part and a thickness of the first sub-base part.

The lead wire may contact directly on the base substrate.

According to another aspect of the invention, a display device comprises a display base substrate; a first substrate including a pad disposed on the display base substrate; and a chip on film connected to the pad, wherein the chip on film includes: a base substrate; a lead wire disposed on the base substrate and connected to the pad; and a driving chip connected to the lead wire, and wherein the lead wire includes: a first lead part having a first thickness; and a second lead part disposed between the first lead part and the driving chip and having a second thickness greater than the first thickness, the second lead part being connected to the driving chip. The first lead part and the second lead part include a same material.

An end of the first lead part may be aligned with an end of the base substrate.

The first lead part and a portion of the second lead part may be connected to the pad.

The display device may further include an anisotropic conductive film disposed between the lead wire and the pad. The lead wire may be electrically connected to the pad through the anisotropic conductive film.

According to still another aspect of the invention, a method of fabricating a chip on film for a display device, the method includes the steps of: preparing a mother film in which a first portion corresponding to an inside of a cutting line of a rectangular frame shape, and a second portion corresponding to an outside of the cutting line are defined, the mother film including a driving chip mounted on the first portion, and a lead wire having an in-cutting line wire part disposed in the first portion and connected to the driving chip, and an out-cutting line wire part disposed in the second portion and connected to the in-cutting line wire part; laser-processing a portion adjacent to the cutting line in the in-cutting line wire part; and cutting the second portion along the cutting line.

In the step of preparing the mother film: the out-cutting line wire part may extend along a first direction from the in-cutting line wire part, the lead wire may include a plurality of lead wires, and the plurality of lead wires may be arranged along a second direction crossing the first direction.

In the step of preparing the mother film: the out-cutting line wire part may include: a first out-cutting line wire part having a first width; and a second out-cutting line wire part having a second width greater than the first width.

After the step of laser processing the portion adjacent to the cutting line in the in-cutting line wire part, the method may further include the step of forming a first lead part adjacent to the cutting line and having a first thickness, and a second lead part disposed between the first lead part and the driving chip and having a second thickness greater than the first thickness.

According to yet still another aspect of the invention, an apparatus for fabricating a chip on film for a display device, the apparatus includes: a reel supply unit configured to supply a mother film in which a first portion corresponding to an inside of a cutting line of a rectangular frame shape, and a second portion corresponding to an outside of the cutting line are defined, the mother film including a driving chip mounted on the first portion, and a lead wire having an in-cutting line wire part disposed in the first portion and connected to the driving chip, and an out-cutting line wire part disposed in the second portion and connected to the in-cutting line wire part; a laser unit configured to laser-process a portion adjacent to the cutting line in the in-cutting line wire part of the mother film supplied from the reel supply unit; and a cutting unit configured to cut the second portion along the cutting line of the mother film processed by the laser unit.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
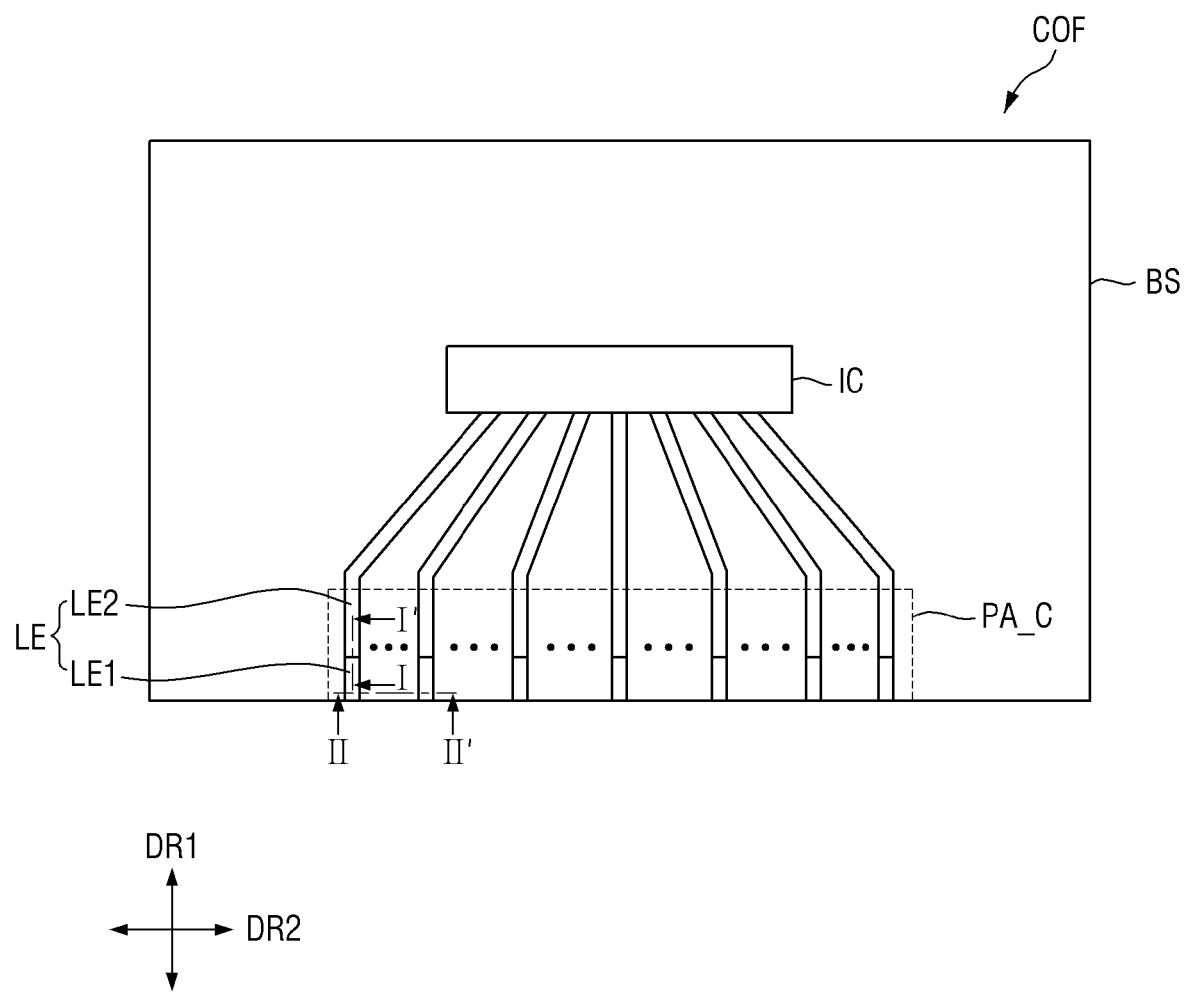
FIG. 1 is a plan view of an embodiment of a chip on film constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, wellknown structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an embodiment of a chip on film constructed according to the principles of the invention.

Referring to FIG. 1, a chip on film COF may be applied to a display device to be described later. The chip on film COF may include a base substrate BS, a driving chip IC on the base substrate BS, and a lead wire LE connected to the driving chip IC on the base substrate BS.

The base substrate BS may support the driving chip IC and the lead wire LE. The base substrate BS may be formed of an insulating material such as a polymer resin. Examples of the polymeric material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The base substrate BS may include polyimide (PI). However, the embodiment is not limited thereto, and the base substrate BS may be a rigid substrate made of glass, quartz or the like.

The base substrate BS may have a rectangular shape. The base substrate BS may include short sides extending along a first direction DR1 and long sides extending along a second direction DR2. The first direction DR1 may be the horizontal direction of the chip on film COF, and the second direction DR2 may be the vertical direction of the chip on film COF, which intersects the first direction DR1.

The corner where the short side and the long side of the base substrate BS meet may be angulated. However, without being limited thereto, it may be rounded.

The planar shape of the base substrate BS is not limited thereto, and may be square, circular, elliptical, or other polygonal shapes. Hereinafter, it will be described under the assumption that the base substrate BS has a rectangular shape in plan view.

The driving chip IC may be located at the center portion of the base substrate BS. The driving chip IC may serve to transmit a data voltage, a data control signal, or a scan control signal to the display device through the lead wire LE.

The lead wire LE may include a first lead part LE1 and a second lead part LE2. The second lead part LE2 may be disposed between the first lead part LE1 and the driving chip IC. The first lead part LE1 and the second lead part LE2 may be physically connected. The first lead part LE1 may extend along the first direction DR1 from a point connected to the second lead part LE2. The second lead part LE2 may be connected to the driving chip IC.

The end of the first lead part LE1 may be aligned with the end of the base substrate BS. For example, the end of the first lead part LE1 may be aligned with the long side edge of the base substrate BS.

The second lead part LE2 and the first lead part LE1 may have different thicknesses. This will be described later with reference to FIGS. 2 and 3.

For example, each of the first lead part LE1 and the second lead part LE2 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In one embodiment, the first lead part LE1 and the second lead part LE2 may include the same material. For example, the first lead part LE1 and the second lead part LE2 may include copper (Cu).

A plurality of lead wires LE may be provided. The plurality of lead wires LE may be arranged along the second direction DR2. At least one of a plurality of second lead parts LE2 may include a bent portion. As shown in FIG. 1, the second lead parts LE2 located on the left side of the plane of FIG. 1 may extend from the driving chip IC along a direction (e.g., lower left direction from the driving chip IC) between the first direction DR1 and the second direction DR2, and then may be bent in the bent portion to extend along the first direction DR1. The second lead parts LE2 located on the right side of the plane of FIG. 1 may extend from the driving chip IC along a direction (e.g., lower right direction from the driving chip IC) between the first direction DR1 and the second direction DR2, and then may be bent in the bent portion to extend along the first direction DR1. The second lead parts LE2 located in the center portion of the plane of FIG. 1 may extend from the driving chip IC along the first direction DR1.

In the plurality of lead wires LE, the first lead parts LE1 and portions of the second lead parts LE2 adjacent to the first lead parts LE1 may form a circuit pad area PA_C. As will be described below, the circuit pad area PA_C may overlap pads of the display device in the thickness direction, and may be connected to the pads of the display device.

Figure 2:
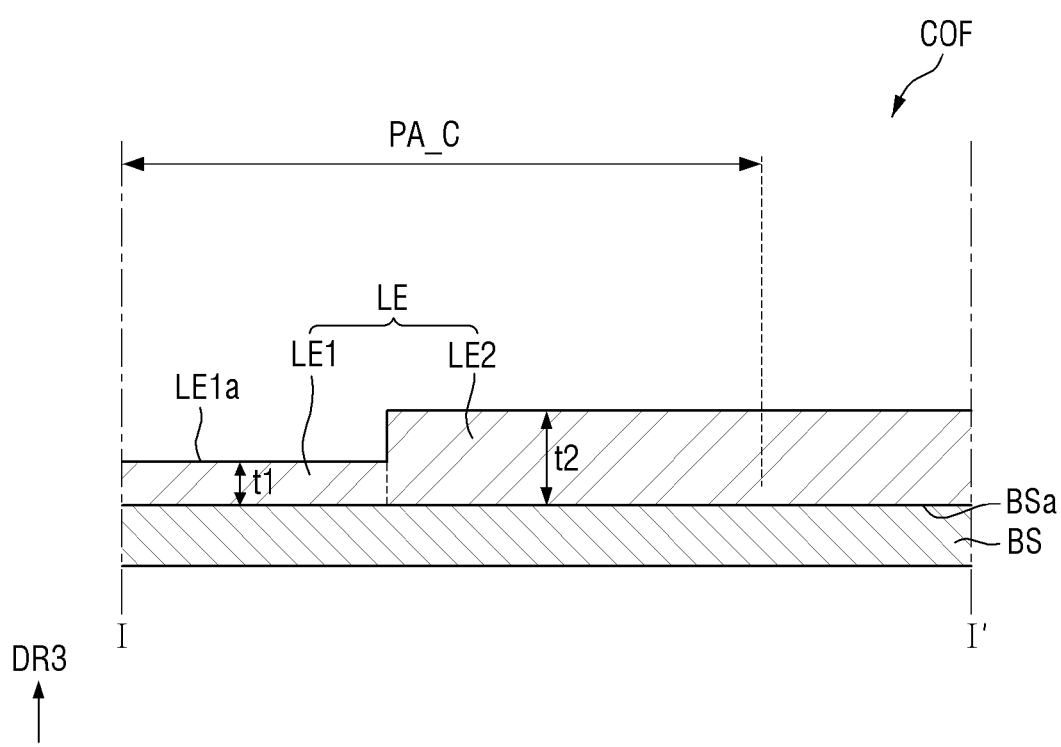
FIG. 2 is a cross-sectional view of a first embodiment taken along line I-I' of FIG. 1.
Figure 3:
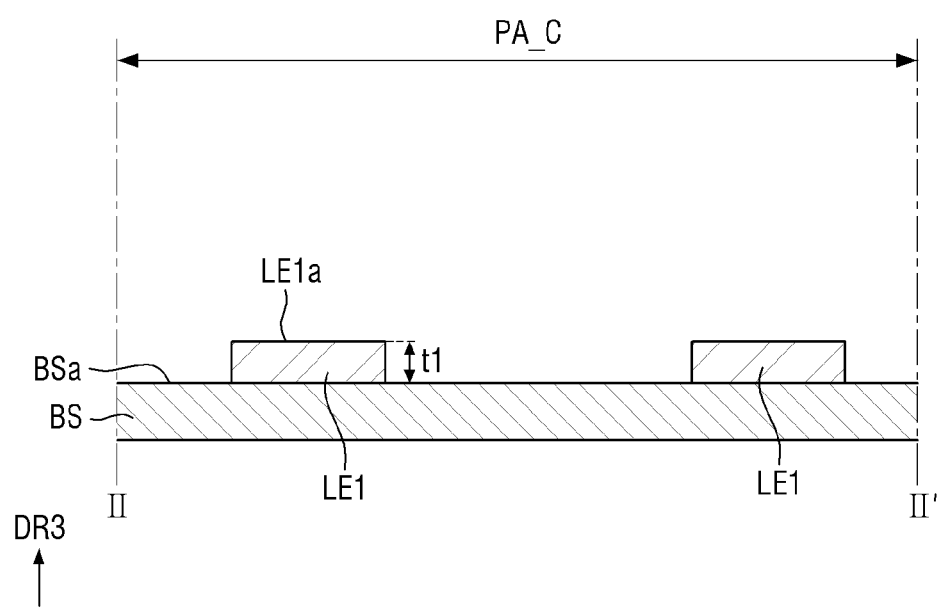
FIG. 3 is a cross-sectional view of a first embodiment taken along line II-II' of FIG. 1.

FIG. 2 is a cross-sectional view of a first embodiment taken along line I-I' of FIG. 1. FIG. 3 is a cross-sectional view of a first embodiment taken along line II-II' of FIG. 1.

Referring to FIGS. 2 and 3, the lead wire LE may be directly arranged on one surface BSa of the base substrate BS. As described above with reference to FIG. 1, the first lead part LE1 and the second lead part LE2 may have different thicknesses from each other. For example, the first lead part LE1 may have a first thickness t1, and the second lead part LE2 may have a second thickness t2. The second thickness t2 may be greater than the first thickness t1. In other words, the first thickness t1 may be smaller than the second thickness t2. A surface LE1a of the first lead part LE1 may be located closer to the one surface BSa of the base substrate BS than a surface of the second lead part LE2.

For example, the first thickness t1 may be about 80% or less of the second thickness t2. In an embodiment, the first thickness t1 may be about 20% to about 80% of the second thickness t2. For example, the second thickness t2 may be about 8 μm, and the first thickness t1 may be about 4 μm, but they are not limited thereto. In the lead wire LE, the second lead part LE2 having the second thickness t2 and the first lead part LE1 having the first thickness t1 smaller than the second thickness t2 may be formed through a laser process to be described later.

Referring to FIG. 3, the adjacent first lead parts LE1 may be disposed to be spaced apart from each other.

According to an embodiment, the lead wire LE includes the second lead part LE2 having the second thickness t2, and the first lead part LE1 having the first thickness t1 smaller than the second thickness t2. Therefore, when cutting the chip on film in a unit of a mother film along a cutting line, since the first lead part LE1 corresponding to the cutting line has a small thickness, the lead wire LE may be less pushed. Accordingly, a short circuit between the adjacent lead wires LE can be prevented. Further, since the first lead part LE1 has a small thickness, it is possible to cut the chip on film in a unit of a mother film even with a small cutting force, thereby increasing the lifetime of a cutting unit.

Hereinafter, another embodiment of the above-described chip on film COF will be described. In the following embodiment, the same components as those of the above-described embodiment are denoted by the same reference numerals, and a description thereof will be omitted or simplified.

Figure 4:
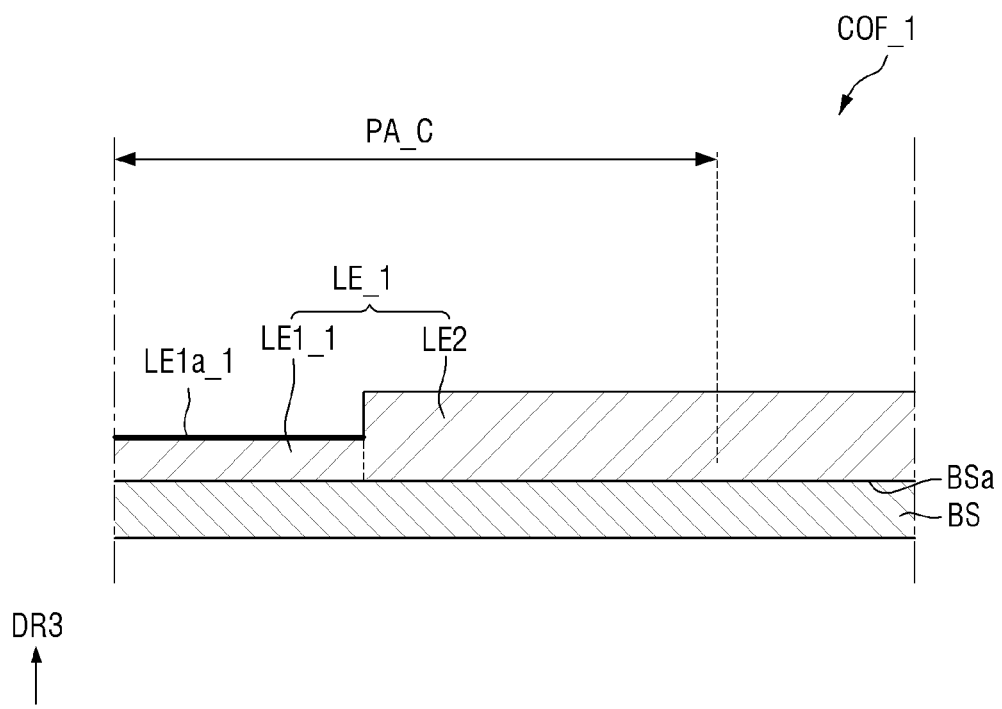
FIG. 4 is a cross-sectional view of a second embodiment taken along line I-I' of FIG. 1.
Figure 5:
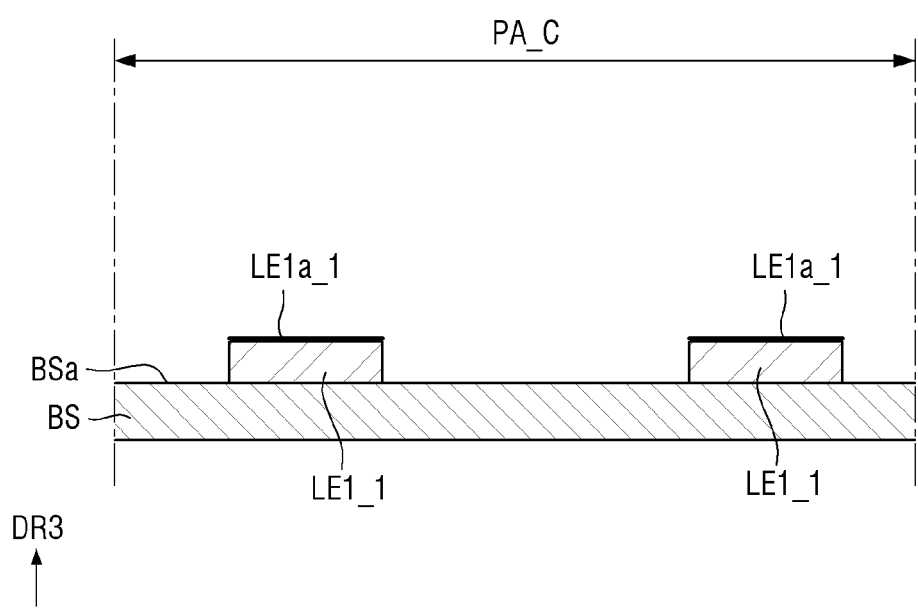
FIG. 5 is a cross-sectional view of a second embodiment taken along line II-II' of FIG. 1.

FIG. 4 is a cross-sectional view of a second embodiment taken along line I-I' of FIG. 1. FIG. 5 is a cross-sectional view of a second embodiment taken along line of FIG. 1.

Referring to FIGS. 4 and 5, a chip on film COF_1 is different from the chip on film COF of FIGS. 1 to 3 in that a lead wire LE_1 includes a first lead part LE1_1 and the second lead part LE2 and a surface LE1a_1 of the first lead part LE1_1 includes a carbonized surface.

That is, the lead wire LE_1 of the chip on film COF_1 may include a first lead part LE1_1 and the second lead part LE2.

A surface LE1a_1 of the first lead part LE1_1 may include a carbonized surface. As shown in FIGS. 4 and 5, the carbonized surface may be generated, during a laser process, on the surface LE1a_1 of the first lead part LE1_1 due to the intensity of the laser and the process time.

According to the illustrated embodiment, the lead wire LE_1 includes the second lead part LE2 having the second thickness t2, and the first lead part LE1_1 having the first thickness t1 smaller than the second thickness t2. Therefore, when cutting the chip on film in a unit of a mother film along a cutting line, since the first lead part LE1_1 corresponding to the cutting line has a small thickness, the lead wire LE_1 may be less pushed. Accordingly, a short circuit between the adjacent lead wires LE_1 can be prevented. Further, since the first lead part LE1_1 has a small thickness, it is possible to cut the chip on film in a unit of a mother film even with a small cutting force, thereby increasing the lifetime of the cutting unit.

Figure 6:
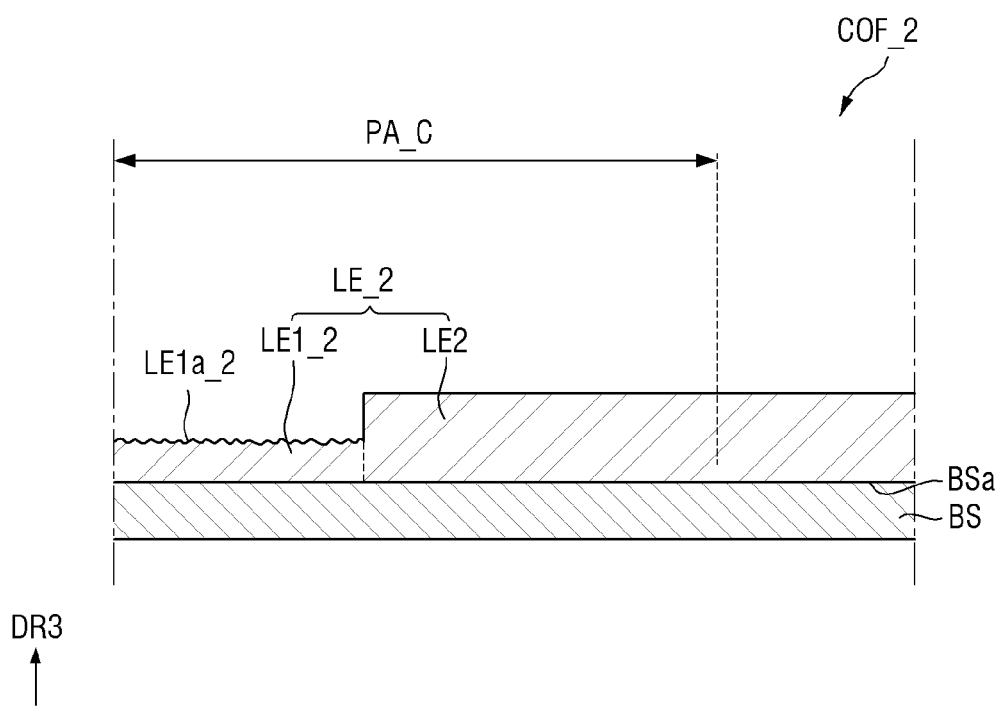
FIG. 6 is a cross-sectional view of a third embodiment taken along line I-I' of FIG. 1.
Figure 7:
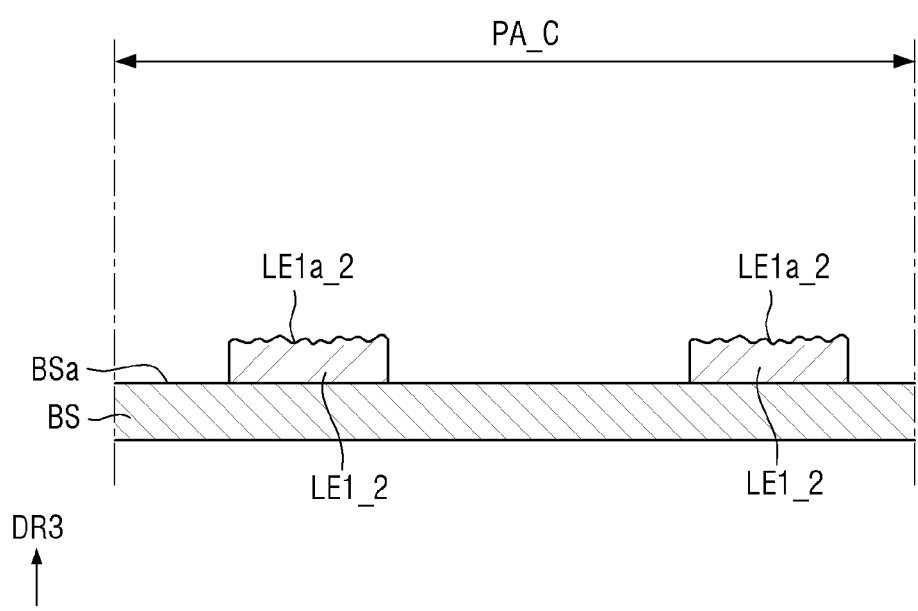
FIG. 7 is a cross-sectional view of a third embodiment taken along line of FIG. 1.

FIG. 6 is a cross-sectional view of a third embodiment taken along line I-I' of FIG. 1. FIG. 7 is a cross-sectional view of a third embodiment taken along line II-II' of FIG. 1.

Referring to FIGS. 6 and 7, a chip on film COF_2 is different from the chip on film COF of FIGS. 1 to 3 in that a lead wire LE_2 includes a first lead part LE1_2 and the second lead part LE2 and a surface LE1a_2 of the first lead part LE1_2 includes surface irregularities.

That is, the lead wire LE_2 of the chip on film COF_2 may include the first lead part LE1_2 and the second lead part LE2.

A surface LE1a_2 of the first lead part LE1_2 may include surface irregularities. As shown in FIGS. 6 and 7, the surface irregularities may be generated, during a laser process, on the surface LE1a_2 of the first lead part LE1_2 due to the intensity of the laser and the process time. In other words, the roughness of the surface LE1a_2 of the first lead part LE1_2 may be greater than the roughness of the surface of the second lead part LE2.

According to the illustrated embodiment, the lead wire LE_2 includes the second lead part LE2 having the second thickness t2, and the first lead part LE1_2 having the first thickness t1 smaller than the second thickness t2. Therefore, when cutting the chip on film in a unit of a mother film along a cutting line, since the first lead part LE1_2 corresponding to the cutting line has a small thickness, the lead wire LE_2 may be less pushed. Accordingly, a short circuit between the adjacent lead wires LE_2 can be prevented. Further, since the first lead part LE1_2 has a small thickness, it is possible to cut the chip on film in a unit of a mother film even with a small cutting force, thereby increasing the lifetime of the cutting unit.

Figure 8:
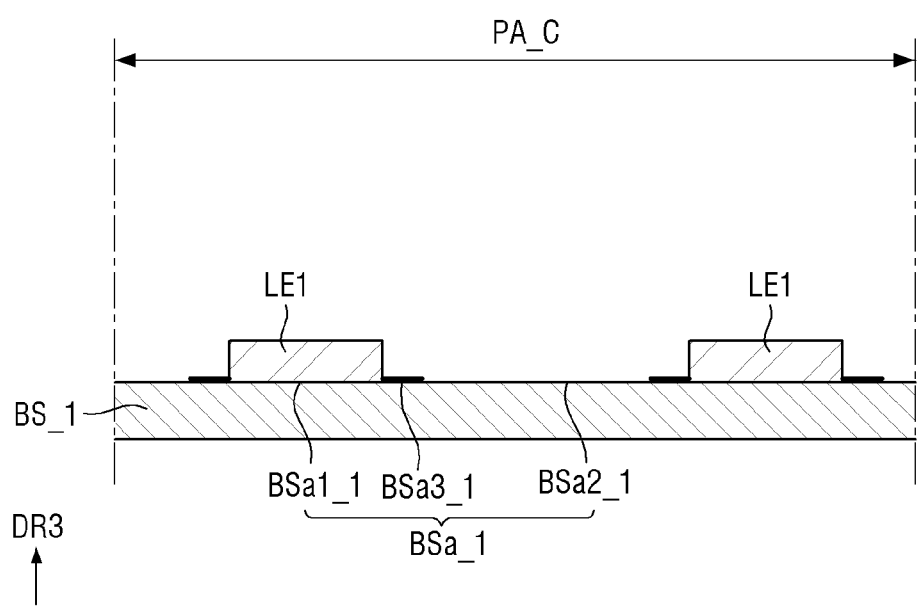
FIG. 8 is a cross-sectional view of another embodiment of a chip on film.

FIG. 8 is a cross-sectional view of another embodiment of a chip on film. For example, FIG. 8 may correspond to the cross-sectional views of FIGS. 3, 5, and 7.

Referring to FIG. 8, a chip on film according to the illustrated embodiment is different from the chip on film COF of FIGS. 1 to 3 in that one surface BSa_1 of a base substrate BS_1 includes a first base surface BSa1_1 that overlaps the first lead part LE1, and a second base surface BSa2_1 and BSa3_1 between the adjacent first lead parts LE1, and the second base surface BSa2_1 and BSa3_1 includes a first sub-base surface BSa2_1 spaced apart from the first base surface BSa1_1, and a second sub-base surface BSa3_1 located between the first sub-base surface BSa2_1 and the first base surface BSa1_1, and the second sub-base surface BSa3_1 includes a carbonized surface.

That is, the one surface BSa_1 of the base substrate BS_1 of the chip on film according to the illustrated embodiment may include the first base surface BSa1_1 that overlaps the first lead part LE1, and the second base surface BSa2_1 and BSa3_1 between the adjacent first lead parts LE1, and the second base surface BSa2_1 and BSa3_1 may include the first sub-base surface BSa2_1 spaced apart from the first base surface BSa1_1, and the second sub-base surface BSa3_1 located between the first sub-base surface BSa2_1 and the first base surface BSa1_1.

As shown in FIG. 8, the second sub-base surface BSa3_1 may include a carbonized surface.

Since the laser process of the first lead part LE1 described above with reference to FIGS. 2 and 3 is performed in consideration of the process margin, the carbonized surface of the second sub-base surface BSa3_1 may be generated in a portion adjacent to the first lead part LE1 in the one surface BSa_1 of the base substrate BS_1.

According to the illustrated embodiment, the lead wire LE includes the second lead part LE2 having the second thickness t2, and the first lead part LE1 having the first thickness t1 smaller than the second thickness t2. Therefore, when cutting the chip on film in a unit of a mother film along a cutting line, since the first lead part LE1 corresponding to the cutting line has a small thickness, the lead wire LE may be less pushed. Accordingly, a short circuit between the adjacent lead wires LE can be prevented. Further, since the first lead part LE1 has a small thickness, it is possible to cut the chip on film in a unit of a mother film even with a small cutting force, thereby increasing the lifetime of the cutting unit.

Figure 9:
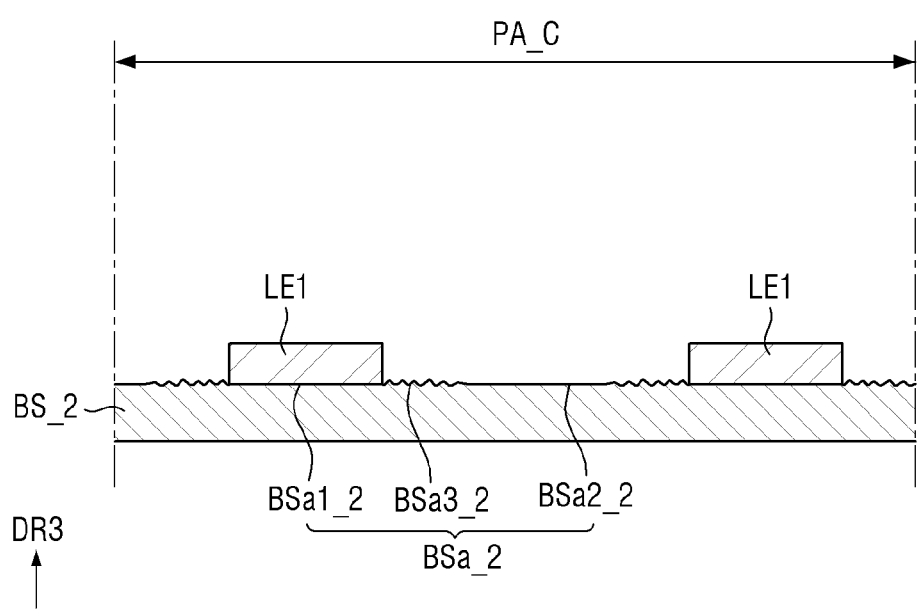
FIG. 9 is a cross-sectional view of still another embodiment of a chip on film.

FIG. 9 is a cross-sectional view of still another embodiment of a chip on film. For example, FIG. 9 may correspond to the cross-sectional views of FIGS. 3, 5, and 7.

Referring to FIG. 9, a chip on film according to the illustrated embodiment is different from the chip on film of FIG. 8 in that one surface BSa_2 of a base substrate BS_2 includes a first base surface BSa1_2 that overlaps the first lead part LE1, and a second base surface BSa2_2 and BSa3_2 between the adjacent first lead parts LE1, and the second base surface BSa2_2 and BSa3_2 includes a first sub-base surface BSa2_2 spaced apart from the first base surface BSa1_2, and a second sub-base surface BSa3_2 located between the first sub-base surface BSa2_2 and the first base surface BSa1_2, and the second sub-base surface BSa3_2 includes surface irregularities.

That is, the one surface BSa_2 of the base substrate BS_2 of the chip on film according to the illustrated embodiment may include the first base surface BSa1_2 2 that overlaps the first lead part LE1, and the second base surface BSa2_2 and BSa3_2 between the adjacent first lead parts LE1, and the second base surface BSa2_2 and BSa3_2 may include the first sub-base surface BSa2_2 spaced apart from the first base surface BSa1_2, and the second sub-base surface BSa3_2 located between the first sub-base surface BSa2_2 and the first base surface BSa1_2.

As shown in FIG. 9, the second sub-base surface BSa3_2 may include surface irregularities. Since the laser process of the first lead part LE1 described above with reference to FIGS. 2 and 3 is performed in consideration of the process margin, the surface irregularities of the second sub-base surface BSa3_2 may be generated in a portion adjacent to the first lead part LE1 in the one surface BSa_2 of the base substrate BS_2. In other words, the roughness of the second sub-base surface BSa3_2 may be greater than the roughness of the first base surface BSa1_2 and the roughness of the first sub-base surface BSa2_2.

According to the illustrated embodiment, the lead wire LE includes the second lead part LE2 having the second thickness t2, and the first lead part LE1 having the first thickness t1 smaller than the second thickness t2. Therefore, when cutting the chip on film in a unit of a mother film along a cutting line, since the first lead part LE1 corresponding to the cutting line has a small thickness, the lead wire LE may be less pushed. Accordingly, a short circuit between the adjacent lead wires LE can be prevented. Further, since the first lead part LE1 has a small thickness, it is possible to cut the chip on film in a unit of a mother film even with a small cutting force, thereby increasing the lifetime of a cutting unit.

Figure 10:
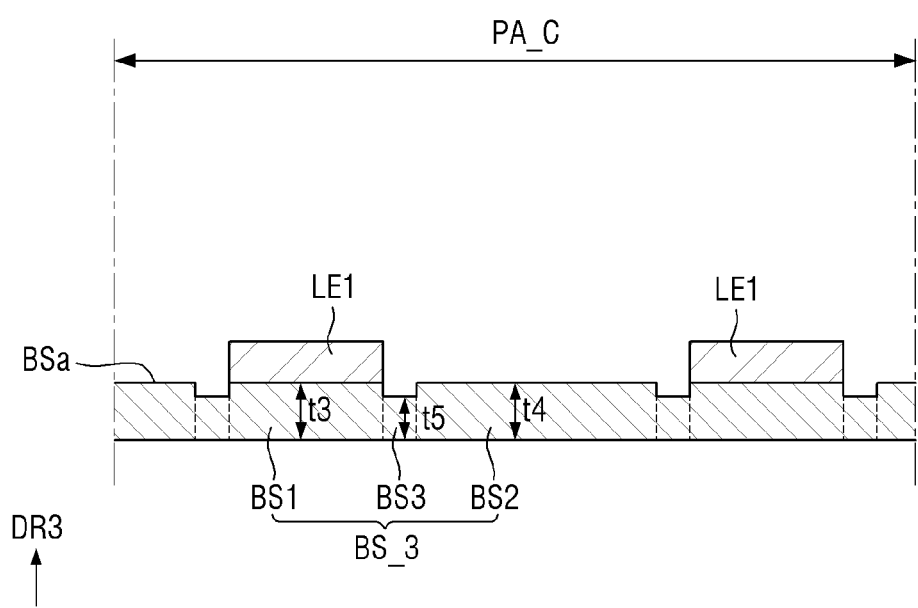
FIG. 10 is a cross-sectional view of yet still another embodiment of a chip on film.

FIG. 10 is a cross-sectional view of yet still another embodiment of a chip on film. For example, FIG. 10 may correspond to the cross-sectional views of FIGS. 3, 5, and 7.

Referring to FIG. 10, a chip on film according to the illustrated embodiment is different from the chip on film COF of FIGS. 1 to 3 in that a base substrate BS_3 includes a first base part BS1 that overlaps the first lead part LE1 and a second base part BS2 and BS3 between the adjacent first lead parts LE1, and the second base part BS2 and BS3 includes a first sub-base part BS2 spaced apart from the first base part BS1, and a second sub-base part BS3 disposed between the first sub-base part BS2 and the first base part BS1, and thicknesses of the first base part BS1, the first sub-base part BS2, and the second sub-base part BS3 are different each other.

That is, the base substrate BS_3 of the chip on film according to the illustrated embodiment may include the first base part BS1 that overlaps the first lead part LE1 and the second base part BS2 and BS3 between the adjacent first lead parts LE1, and the second base part BS2 and BS3 may include the first sub-base part BS2 spaced apart from the first base part BS1, and the second sub-base part BS3 disposed between the first sub-base part BS2 and the first base part BS1.

As shown in FIG. 10, the first base part BS1 may have a third thickness t3, the first sub-base part BS2 may have a fourth thickness t4, and the second sub-base part BS3 may have a fifth thickness t5. The fifth thickness t5 may be smaller than the third thickness t3 and the fourth thickness t4.

Since the laser process of the first lead part LE1 described above with reference to FIGS. 2 and 3 is performed in consideration of the process margin, the second sub-base part BS3 may have the fifth thickness t5 which is the smallest in a portion adjacent to the first lead part LE1 in the base substrate BS_3.

According to the illustrated embodiment, the lead wire LE includes the second lead part LE2 having the second thickness t2, and the first lead part LE1 having the first thickness t1 smaller than the second thickness t2. Therefore, when cutting the chip on film in a unit of a mother film along a cutting line, since the first lead part LE1 corresponding to the cutting line has a small thickness, the lead wire LE may be less pushed. Accordingly, a short circuit between the adjacent lead wires LE can be prevented. Further, since the first lead part LE1 has a small thickness, it is possible to cut the chip on film in a unit of a mother film even with a small cutting force, thereby increasing the lifetime of the cutting unit.

In some embodiments, the carbonized surface and the surface irregularities generated on the top surface of the first lead parts LE1_1 and LE1_2 or around the first lead part LE1, which have been described above with reference to FIGS. 4 to 10, may exist together.

Hereinafter, a method of fabricating the above-described chip on film COF will be described. In the following embodiment, the same components as those of the above-described embodiment are denoted by the same reference numerals, and a description thereof will be omitted or simplified.

Figure 11:
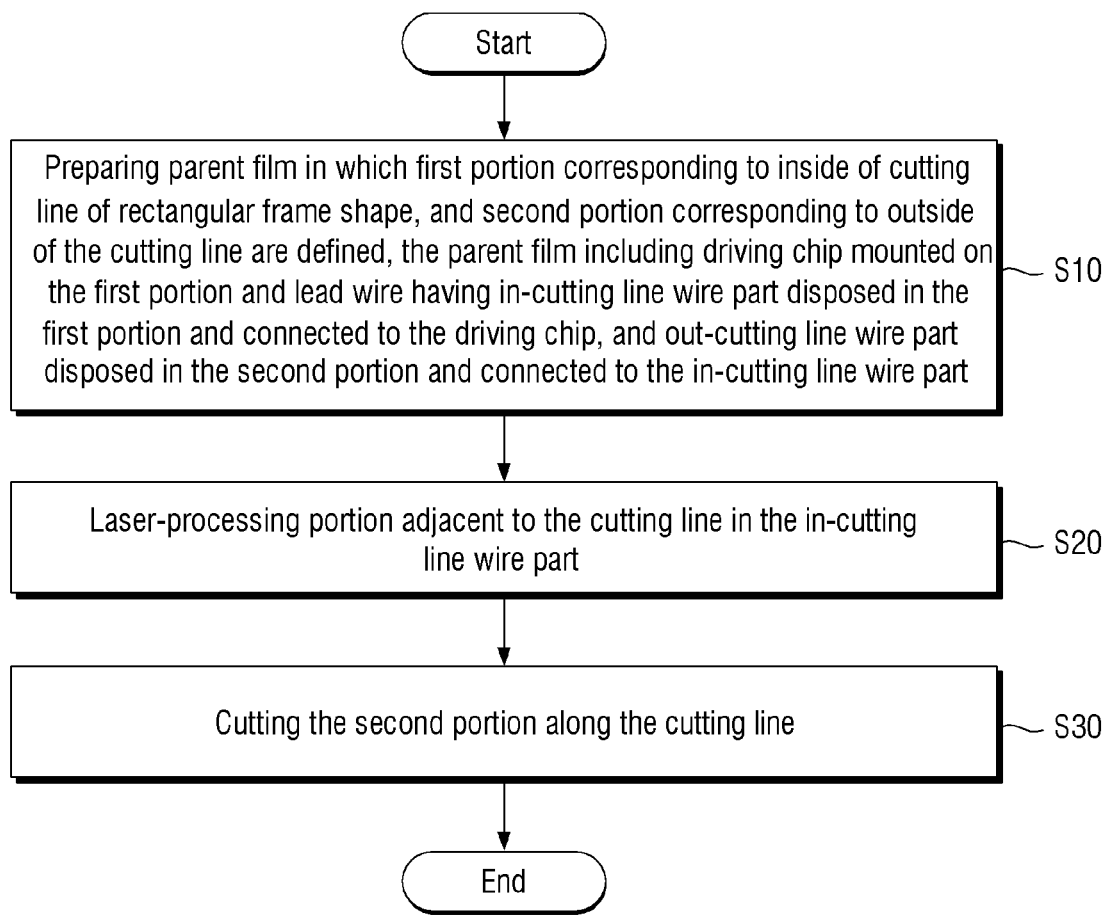
FIG. 11 is a flowchart of an embodiment of a method of fabricating a chip on film according to the principles of the invention.
Figure 12:
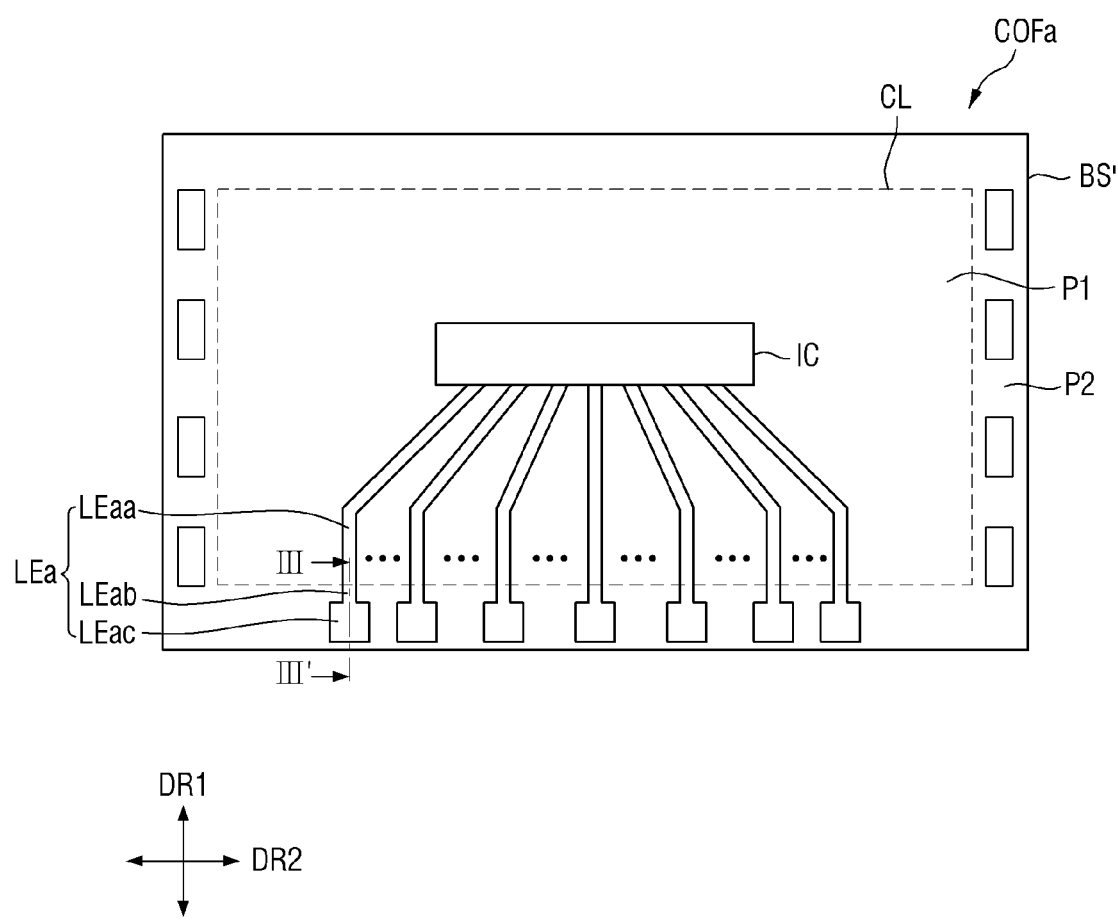
FIG. 12 is a plan view illustrating one process step of a method of fabricating a chip on film of FIG. 11.
Figure 13:
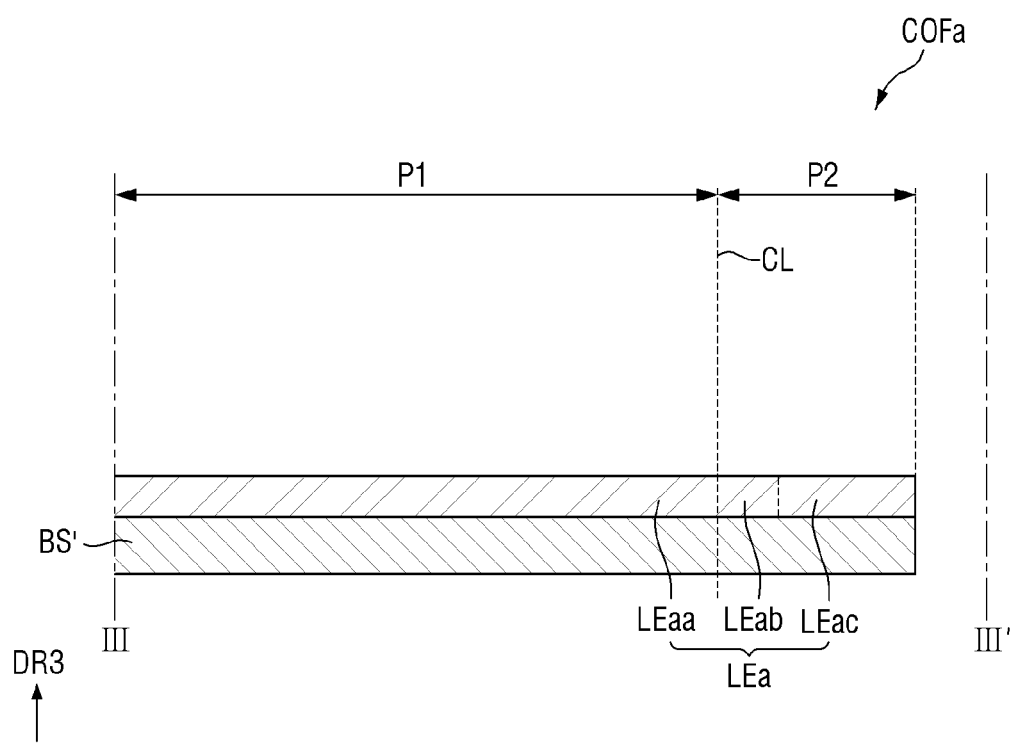
FIG. 13 is a cross-sectional view taken along line of FIG. 12.
Figure 14:
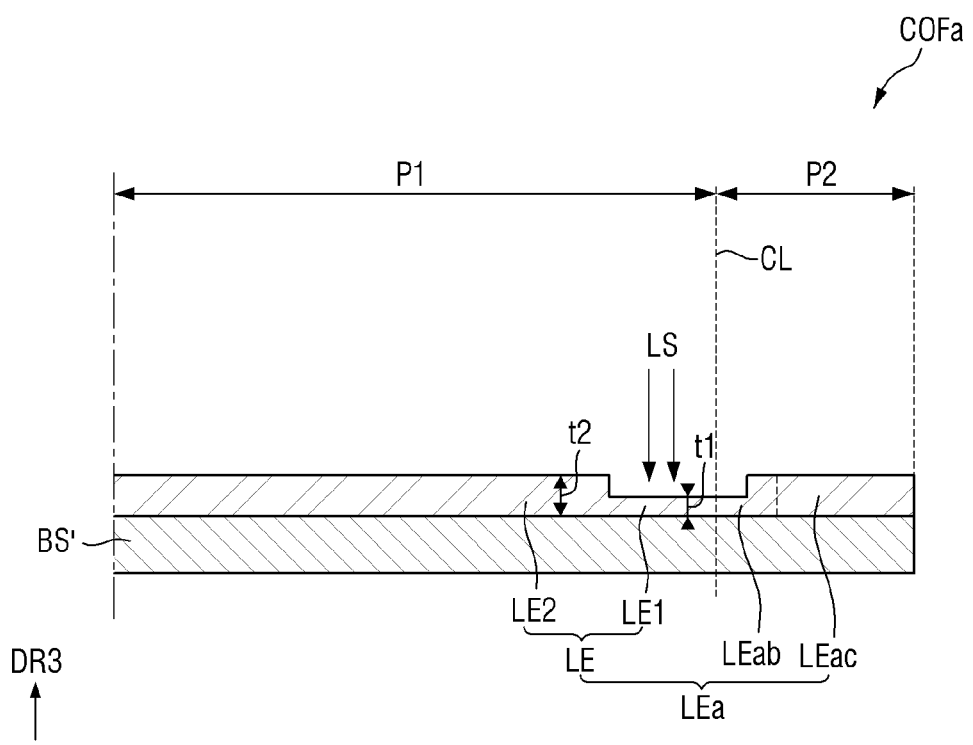
FIGS. 14 and 15 are cross-sectional views showing other process steps of the method of fabricating a chip on film of FIG. 11.
Figure 15:
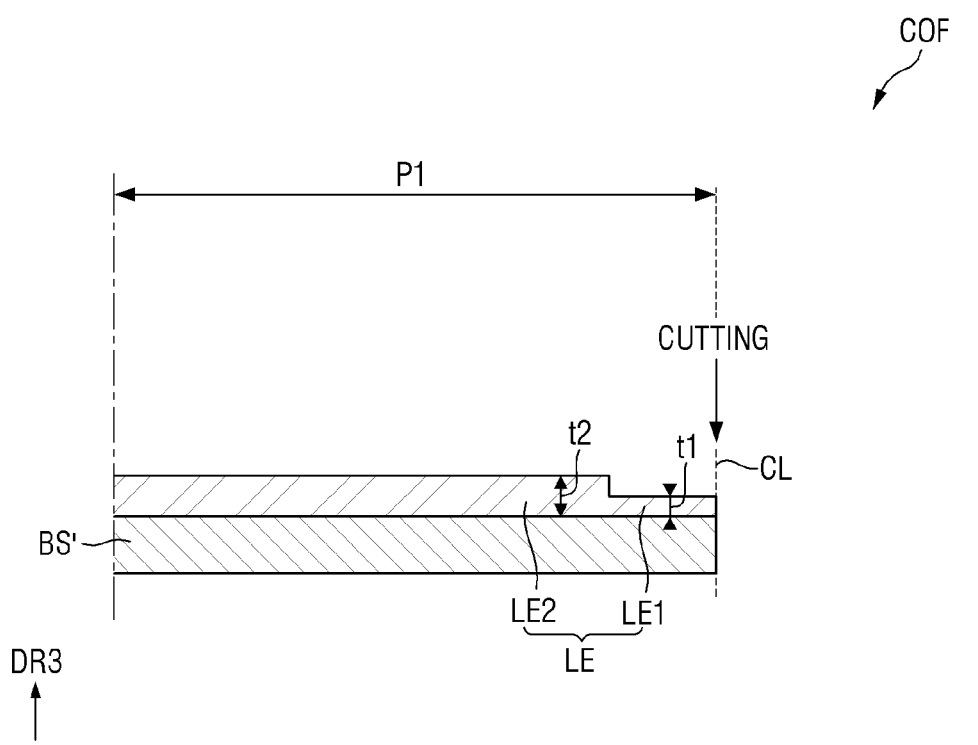

FIG. 11 is a flowchart of an embodiment of a method of fabricating a chip on film according to the principles of the invention. FIG. 12 is a plan view illustrating one process step of a method of fabricating a chip on film of FIG. 11. FIG. 13 is a cross-sectional view taken along line III-III' of FIG. 12. FIGS. 14 and 15 are cross-sectional views showing other process steps of the method of fabricating a chip on film of FIG. 11.

Referring to FIGS. 11 to 13, according to a method of fabricating a chip on film, first, there is prepared a mother film COFa in which a first portion P1 corresponding to the inside of a cutting line CL of a rectangular frame shape, and a second portion P2 corresponding to the outside of the cutting line CL are defined (step S10). Here, the mother film COFa includes a driving chip IC mounted on the first portion P1 and a lead wire LEa having an in-cutting line wire part LEaa disposed in the first portion P1 and connected to the driving chip IC, and an out-cutting line wire part LEab and LEac disposed in the second portion P2 and connected to the in-cutting line wire part LEaa. The lead wire LEa and the driving chip IC may be arranged on a base substrate BS'.

The mother film COFa may have a rectangular shape. The mother film COFa may include short sides extending along the first direction DR1 and long sides extending along the second direction DR2. The first direction DR1 may be the horizontal direction of the mother film COFa, and the second direction DR2 may be the vertical direction of the mother film COFa, which intersects the first direction DR1.

The corner where the short side and the long side of the mother film COFa meet may be angulated. However, without being limited thereto, it may be rounded.

The planar shape of the mother film COFa is not limited thereto, and may be square, circular, elliptical, or other polygonal shapes. Hereinafter, it will be described under the assumption that the mother film COFa has a rectangular shape in plan view.

As shown in FIG. 12, the cutting line CL may be defined in the mother film COFa. The cutting line CL may have a rectangular frame shape. The mother film COFa may be divided, with respect to the cutting line CL, into the first portion P1 corresponding to the inside of the cutting line CL and the second portion P2 corresponding to the outside of the cutting line CL.

The driving chip IC may be located at the center portion of the mother film COFa. The driving chip IC may be located in the first portion P1.

The lead wire LEa may include the in-cutting line wire part LEaa disposed in the first portion P1, and the out-cutting line wire part LEab and LEac disposed in the second portion P2 and connected to the in-cutting line wire part LEaa.

The in-cutting line wire part LEaa may not be disposed in the second portion P2, and the out-cutting line wire part LEab and LEac may not be disposed in the first portion P1.

The in-cutting line wire part LEaa may be physically connected to the out-cutting line wire part LEab and LEac. The out-cutting line wire part LEab and LEac may include a first out-cutting line wire part LEab connected to the in-cutting line wire part LEaa, and a second out-cutting line wire part LEac spaced apart from the in-cutting line wire part LEaa with the first out-cutting line wire part LEab therebetween.

The in-cutting line wire part LEaa and the out-cutting line wire part LEab and LEac may include the same material. For example, the in-cutting line wire part LEaa and the out-cutting line wire part LEab and LEac may include copper (Cu).

The out-cutting line wire part LEab and LEac may extend along the first direction DR1 from the in-cutting line wire part LEaa.

A plurality of lead wires LEa may be provided, and the plurality of lead wires LEa may be arranged along the second direction DR2.

The first out-cutting line wire part LEab may have a first width, and the second out-cutting line wire part LEac may have a second width greater than the first width. The second out-cutting line wire part LEac may be a test pad, but is not limited thereto.

The planar shape of the in-cutting line wire part LEaa is substantially the same as the planar shape of the lead wire LE described with reference to FIG. 1, and thus a repeated description is omitted.

Subsequently, referring to FIGS. 11 and 14 together with FIGS. 1 to 3, a portion adjacent to the cutting line CL in the in-cutting line wire part LEaa is processed with a laser LS (step S20). Through this process, the above-described lead wire LE (LE1 and LE2) shown in FIGS. 1 to 3 may be formed. The lead wire LE may be directly arranged on the one surface BSa of the base substrate BS. The first lead part LE1 and the second lead part LE2 may have different thicknesses from each other. For example, referring to FIGS. 2, 14 and 15, the first lead part LE1 may have the first thickness t1, and the second lead part LE2 may have the second thickness t2. The second thickness t2 may be greater than the first thickness t1. In other words, the first thickness t1 may be smaller than the second thickness t2. The surface LE1a of the first lead part LE1 may be located closer to the one surface BSa of the base substrate BS than the surface of the second lead part LE2.

For example, the first thickness t1 may be about 80% or less of the second thickness t2. In a preferred embodiment, the first thickness t1 may be about 20% to about 80% of the second thickness t2. For example, the second thickness t2 may be about 8 μm, and the first thickness t1 may be about 4 μm, but they are not limited thereto.

By the laser LS processing (step S20), a portion of the out-cutting line wire part LEab adjacent to the cutting line CL may also have a reduced thickness. The laser LS processing (step S20) may be performed by a laser unit. The laser may include a continuous wave laser (CW laser) or a pulse laser.

Next, referring to FIGS. 11 and 15 together with FIGS. 1 to 3, the second portion P2 is cut away along the cutting line CL (step S30). The cutting (step S30) of the second portion P2 may be performed by a cutting unit.

According to an embodiment, as shown in FIGS. 2 and 15, the lead wire LE includes the second lead part LE2 having the second thickness t2, and the first lead part LE1 having the first thickness t1 smaller than the second thickness t2. Therefore, when cutting the mother film COFa along the cutting line CL, since the first lead part LE1 or both the first lead part LE1 and the first out-cutting line wire part LEab corresponding to the cutting line CL have small thicknesses, the lead wire LEa may be less pushed. Accordingly, a short circuit between the adjacent lead wires LEa can be prevented. Further, since the first lead part LE1 or both the first lead part LE1 and the first out-cutting line wire part LEab have small thicknesses, it is possible to cut the mother film COFa even with a small cutting force, thereby increasing the lifetime of the cutting unit.

Hereinafter, a display device including the above-described chip on film COF will be described. In the following embodiment, the same components as those of the above-described embodiment are denoted by the same reference numerals, and a description thereof will be omitted or simplified.

Figure 16:
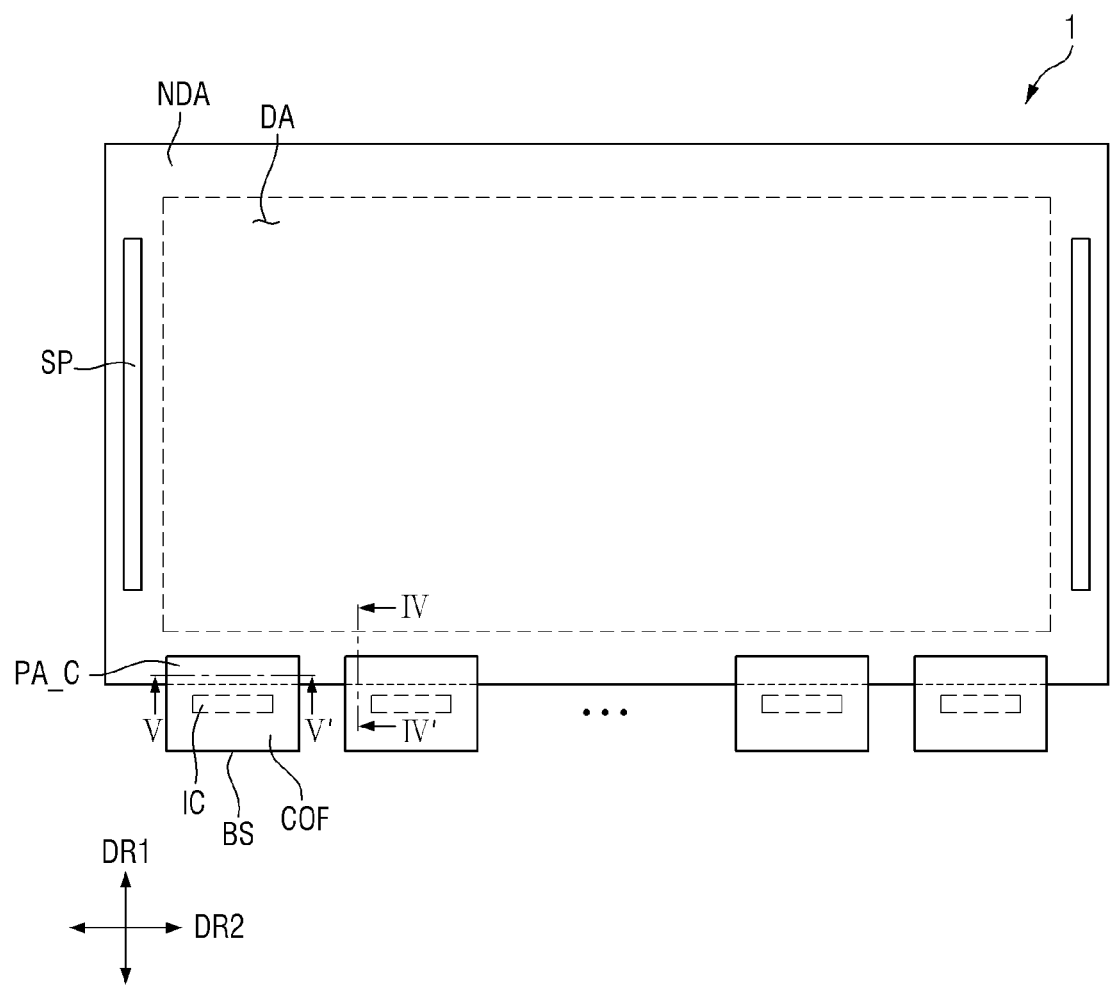
FIG. 16 is a plan view of an embodiment of a display device constructed according to the principles of the invention.
Figure 17:
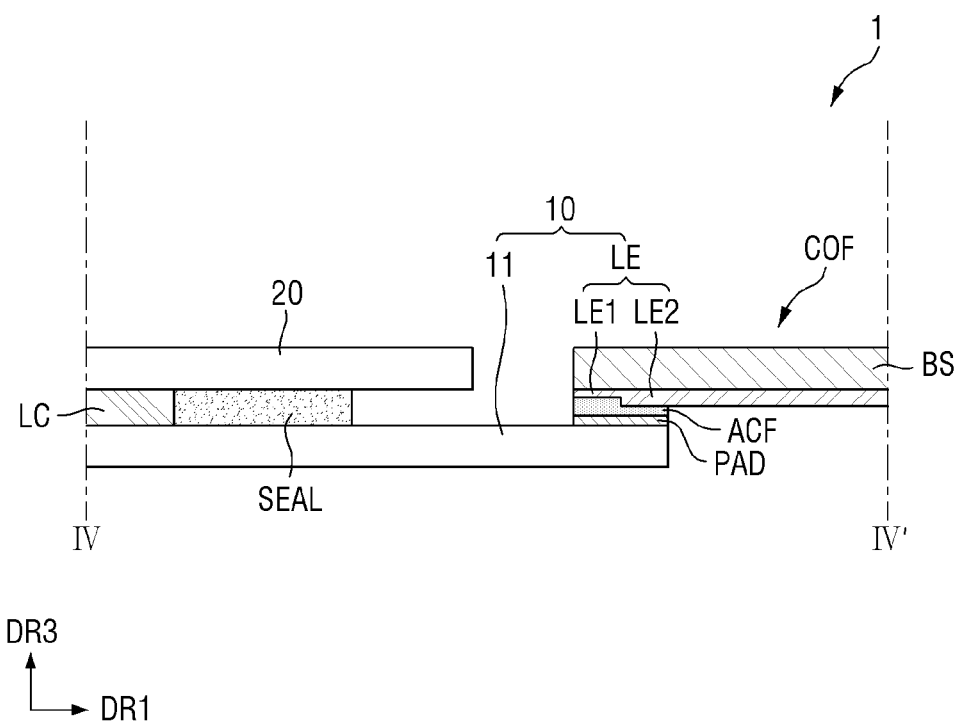
FIG. 17 is a cross-sectional view taken along line IV-IV' of FIG. 16.
Figure 18:
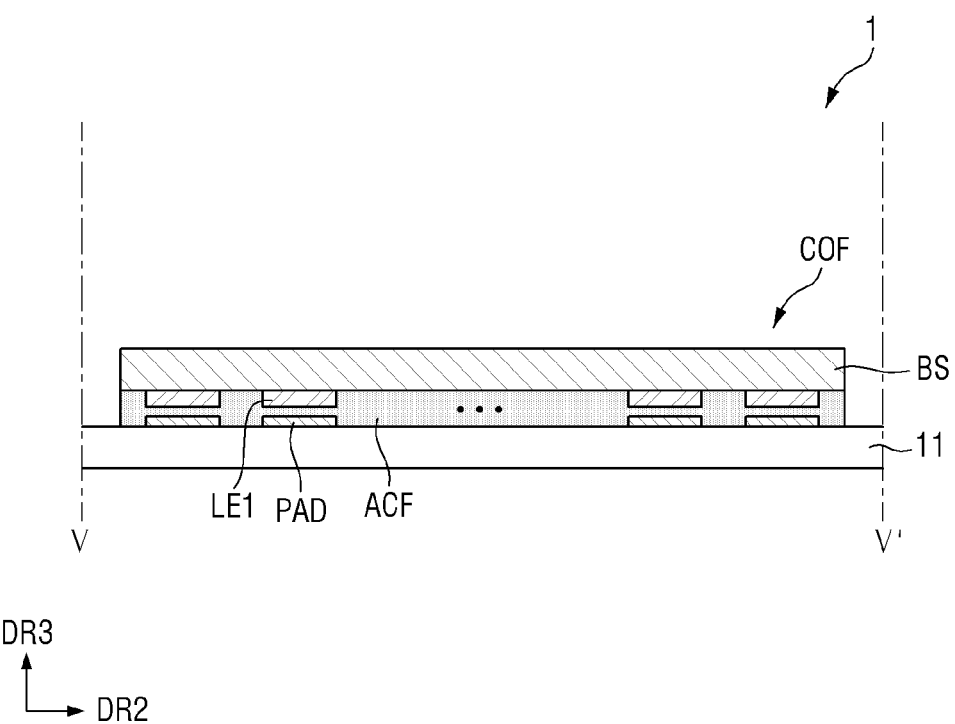
FIG. 18 is a cross-sectional view taken along line V-V of FIG. 16.

FIG. 16 is a plan view of an embodiment of a display device constructed according to the principles of the invention. FIG. 17 is a cross-sectional view taken along line IV-IV' of FIG. 16. FIG. 18 is a cross-sectional view taken along line V-V of FIG. 16.

Referring to FIGS. 16 to 18 together with FIGS. 1 to 3, a display device 1 may refer to all electronic devices that provide a display screen. Examples of the display device 1 may include a television, a laptop computer, a monitor, a billboard, a mobile phone, a smartphone, a tablet personal computer (PC), an electronic watch, a smart watch, a watch phone, a mobile communication terminal, an electronic notebook, an electronic book, a portable multimedia player (PMP), a navigation device, a game machine, a digital camera, an Internet-of-Things device and the like, which provide a display screen.

The display device 1 may be variously classified by a display method. For example, types of the display device 1 may include a liquid crystal display (LCD), an organic light emitting display (OLED), an inorganic light emitting display (inorganic EL), a quantum dot light emitting display (QED), a micro-LED display, a nano-LED display, a plasma display device (PDP), a field emission display (FED) and a cathode ray tube (CRT) display, an electrophoretic display (EPD) and the like. Hereinafter, a liquid crystal display (LCD) will be described as an example of the display device 1. The display device 1 may have a rectangular shape in plan view (i.e., when viewed in plan view).

The display device 1 may include long sides extending along the first direction DR1 and short sides extending along the second direction DR2. However, the embodiment is not limited thereto, and the long sides of the display device 1 may extend along the second direction DR2, and the short sides thereof may extend along the first direction DR1.

The display device 1 may include a display area DA and a non-display area NDA. The display area DA is an active area in which an image is displayed. The display area DA may have a rectangular shape in plan view similar to the overall shape of the display device 1.

The display area DA may include a plurality of pixels. The pixel may be a basic unit for displaying a screen.

The non-display area NDA may be disposed around the display area DA. The non-display area NDA may completely or partially surround the display area DA. The display area DA may have a rectangular shape, and the non-display area NDA may be disposed adjacent to four sides of the display area DA. The non-display area NDA may form a bezel of the display device 1.

Chip on films COF provided with driving circuits or driving elements for driving the display area DA may be disposed in the non-display area NDA. For example, a plurality of chip on films COF may be disposed in the non-display area NDA adjacent to the lower long side of the display device 1 in the first direction DR1.

The chip on films COF are not limited thereto, and may be further disposed in the non-display area NDA adjacent to the upper long side of the display device 1 in the first direction DR1.

A scan driver SP may be disposed in the non-display area NDA adjacent to the left short side of the display device 1 in the second direction DR2. The scan driver SP may also be disposed in the non-display area NDA adjacent to the right short side of the display device 1 in the second direction DR2.

The circuit pad area PA_C of the chip on film COF may be attached to the non-display area NDA of the display device 1.

The display device 1 may include a lower substrate 10 including a display base substrate 11 and a pad PAD, an upper substrate 20, a sealing member SEAL, and a liquid crystal layer LC disposed between the upper substrate 20 and the lower substrate 10.

The planar size of the lower substrate 10 and the planar size of the upper substrate 20 may be different from each other. For example, the planar size of the lower substrate 10 may be larger than the planar size of the upper substrate 20.

At least one side of the lower substrate 10 may protrude compared to the upper substrate 20 in plan view.

The above-described chip on film COF may be attached to a portion of the one side of the lower substrate 10 protruding in the first direction DR1 compared to the upper substrate 20. The sealing member SEAL may be disposed adjacent to all long sides and all short sides of the upper substrate 20 in plan view. The sealing member SEAL may be located at the center portion or inside of all long sides and all short sides of the upper substrate 20 in plan view. In plan view, all long sides and all short sides of the upper substrate 20 may completely surround the sealing member SEAL. The sealing member SEAL may have a rectangular frame shape continuously extending along all long sides and all short sides of the upper substrate 20 in plan view.

The liquid crystal layer LC may be surrounded by the sealing member SEAL in plan view.

The pad PAD may be electrically connected to a pixel of the display area DA. The pad PAD may be electrically connected to a data line of the pixel.

The pad PAD and the lead wire LE may be connected through an anisotropic conductive film ACF interposed therebetween. The pad PAD and the lead wire LE may be electrically connected through the anisotropic conductive film ACF interposed therebetween. The first lead part LE1 and a portion of the second lead part LE2 of the lead wire LE may overlap the pad PAD in the thickness direction.

The anisotropic conductive film ACF may directly contact the side surfaces and top surface of the pad PAD, and the side surfaces and bottom surface of the lead wire LE1 and LE2. The anisotropic conductive film ACF may fill the space between the adjacent pads PAD and the space between the adjacent lead wires LE1 and LE2.

According to the illustrated embodiment, as shown in FIGS. 1 to 3, the lead wire LE includes the second lead part LE2 having the second thickness t2, and the first lead part LE1 having the first thickness t1 smaller than the second thickness t2. Therefore, when cutting the chip on film in a unit of a mother film along a cutting line, since the first lead part LE1 corresponding to the cutting line has a small thickness, the lead wire LE may be less pushed. Accordingly, a short circuit between the adjacent lead wires LE can be prevented. Further, since the first lead part LE1 has a small thickness, it is possible to cut the chip on film in a unit of a mother film even with a small cutting force, thereby increasing the lifetime of the cutting unit.

Figure 19:
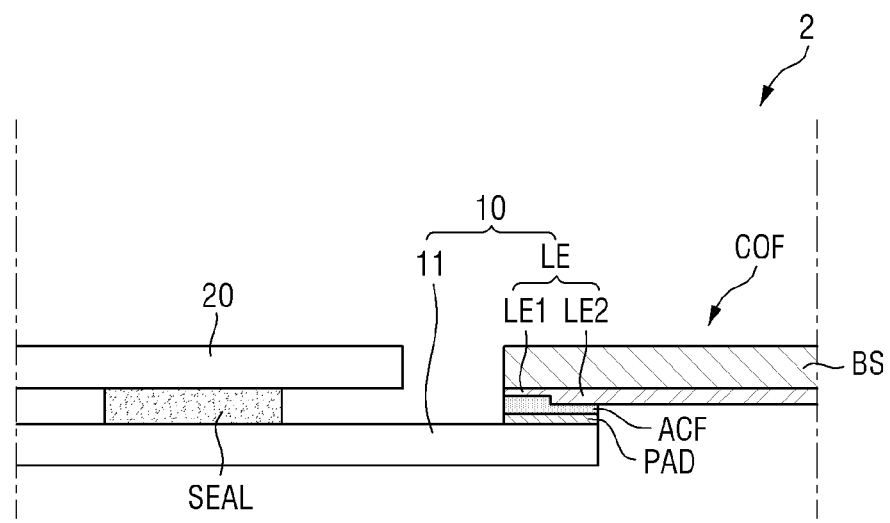
FIG. 19 is a cross-sectional view of another embodiment of a display device.

FIG. 19 is a cross-sectional view of another embodiment of a display device. For example, FIG. 19 may correspond to the cross-sectional views of FIG. 17.

Referring to FIG. 19, a display device 2 according to the illustrated embodiment is different from the display device 1 of FIGS. 16 to 18 in that an organic light emitting display device is applied.

That is, the organic light emitting display device may be used as the display device 2 according to the illustrated embodiment. Unlike the display device 1 of FIGS. 16 to 18, the display device 2 may further include an organic light emitting element with the exclusion of the liquid crystal layer LC.

According to the illustrated embodiment, as shown in FIGS. 1 to 3, the lead wire LE includes the second lead part LE2 having the second thickness t2, and the first lead part LE1 having the first thickness t1 smaller than the second thickness t2. Therefore, when cutting the chip on film in a unit of a mother film along a cutting line, since the first lead part LE1 corresponding to the cutting line has a small thickness, the lead wire LE may be less pushed. Accordingly, a short circuit between the adjacent lead wires LE can be prevented. Further, since the first lead part LE1 has a small thickness, it is possible to cut the chip on film into a unit of a mother film even with a small cutting force, thereby increasing the lifetime of the cutting unit.

Figure 20:
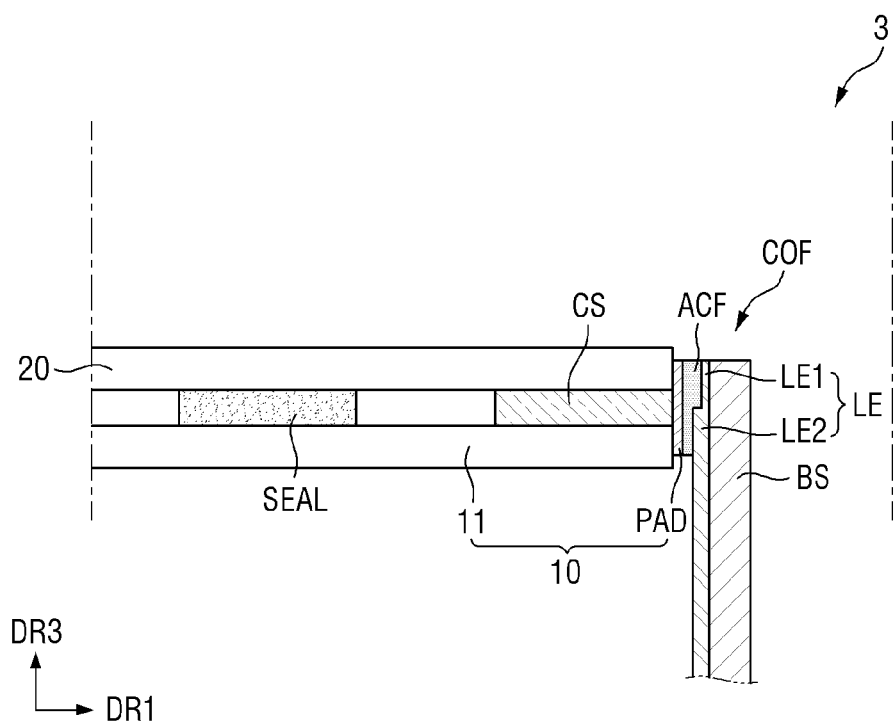
FIG. 20 is a cross-sectional view of still another embodiment of a display device.

FIG. 20 is a cross-sectional view of still another embodiment of a display device. For example, FIG. 20 may correspond to the cross-sectional views of FIG. 17.

Referring to FIG. 20, a display device 3 according to the illustrated embodiment is different from the display device 1 shown in FIGS. 16 to 18 in that the chip on film COF is attached to the side surfaces of the lower substrate 10 and the upper substrate 20.

That is, as shown in FIG. 20, in the display device 3 according to the illustrated embodiment, the chip on film COF may be attached to the side surface of the lower substrate 10 and the side surface of the upper substrate 20.

The pad PAD may be disposed on the side surfaces of the lower substrate 10 and the upper substrate 20. The display device 3 according to the illustrated embodiment may further include a column spacer CS disposed between the lower substrate 10 and the upper substrate 20. The side surface of the column spacer CS may be aligned with the side surface of the lower substrate 10 and the side surface of the upper substrate 20. The pad PAD may be disposed on the side surface of the column spacer CS, the side surface of the lower substrate 10, and the side surface of the upper substrate 20. Other configurations are the same as those described above with reference to FIGS. 16 to 18, and thus, a repeated description is omitted.

Figure 21:
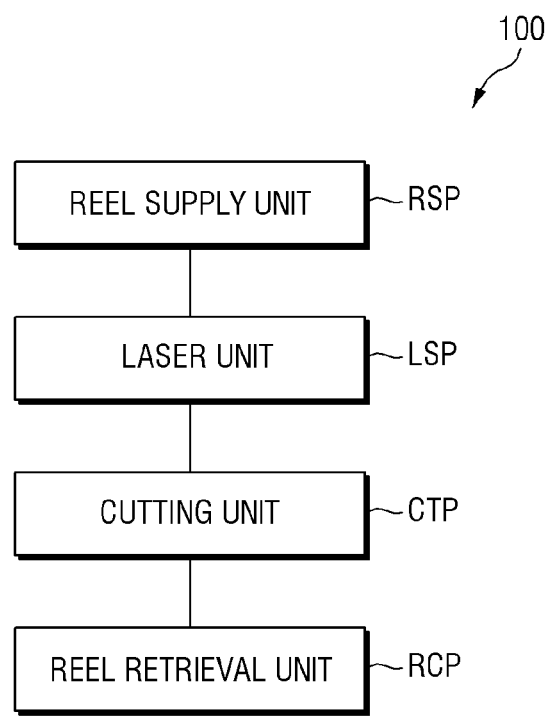
FIG. 21 is a block diagram of an embodiment of an apparatus for fabricating a chip on film constructed according to the principles of the invention.

FIG. 21 is a block diagram of an embodiment of an apparatus for fabricating a chip on film constructed according to the principles of the invention.

Referring to FIG. 21, an apparatus 100 for fabricating a chip on film according to the illustrated embodiment may include a reel supply unit RSP, a laser unit LSP, a cutting unit CTP, and a reel retrieval unit RCP.

The reel supply unit RSP may serve to transfer the mother film COFa described with reference to FIGS. 12 and 13 to the laser unit LSP.

As described above with reference to FIG. 14, the laser unit LSP may serve to laser-process a portion adjacent to the cutting line CL in the in-cutting line wire part LEaa. Accordingly, the above-described lead wire LE (LE1 and LE2) may be formed. Further, the laser unit LSP may irradiate a laser to a portion adjacent to the cutting line CL in the out-cutting line wire part LEab, thereby reducing the thickness of the portion adjacent to the cutting line CL in out-cutting line wire part LEab. The laser irradiated from the laser unit LSP may include a continuous wave laser (CW laser) or a pulse laser.

As illustrated in FIG. 15, the cutting unit CTP may serve to cut away the second portion P2 from the mother film COFa, which has been processed by the laser unit LSP, along the cutting line CL.

The chip on film COF (see FIGS. 1 to 3) cut by the cutting unit CTP may be retrieved through the reel retrieval unit RCP.

According to an embodiment, the lead wire LE includes the second lead part LE2 having the second thickness t2, and the first lead part LE1 having the first thickness t1 smaller than the second thickness t2. Therefore, when cutting the mother film COFa along the cutting line CL, since the first lead part LE1 or both the first lead part LE1 and the first out-cutting line wire part LEab corresponding to the cutting line CL have small thicknesses, the lead wire LEa may be less pushed. Accordingly, a short circuit between the adjacent lead wires LEa can be prevented. Further, since the first lead part LE1 or both the first lead part LE1 and the first out-cutting line wire part LEab have small thicknesses, it is possible to cut the mother film COFa even with a small cutting force, thereby increasing the lifetime of the cutting unit.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A chip on film for a display device, the chip on film comprising:
a base substrate;
a plurality of lead wires disposed on the base substrate; and
a driving chip connected to the plurality of lead wires,
wherein each of the plurality of lead wires includes:
a first lead part having a first thickness; and
a second lead part disposed between the first lead part and the driving chip and having a second thickness greater than the first thickness, the second lead part being connected to the driving chip,
wherein the first lead part and the second lead part comprise a same material, and
wherein the base substrate includes a first base part overlapping the first lead part, and a second base part without overlapping the first lead part,
the second base part includes a first sub-base part spaced apart from the first base part, and a second sub-base part located between the first sub-base part and the first base part, and
a thickness of the second sub-base part is smaller than each of a thickness of the first base part and a thickness of the first sub-base part.

2. The chip on film of claim 1, wherein an end of the first lead part is aligned with an end of the base substrate.

3. The chip on film of claim 2, wherein the plurality of lead wires contact directly on the base substrate.

4. The chip on film of claim 2, wherein the first lead part extends along a first direction from the second lead part, and the plurality of lead wires are arranged along a second direction crossing the first direction.

5. The chip on film of claim 4, wherein the second lead part includes a bent portion, and
the second lead part extends from a portion connected to the driving chip along the first direction and one direction crossing the second direction, and then extends from the bent portion along the first direction.

6. The chip on film of claim 5, wherein the first thickness has a value of about 80% or less of the second thickness.

7. The chip on film of claim 1, wherein a surface of the first lead part comprises a carbonized surface.

8. The chip on film of claim 1, wherein a surface of the first lead part comprises surface irregularities, and
a roughness of the surface of the first lead part is greater than a roughness of the surface of the second lead part.

9. The chip on film of claim 1,
wherein a surface of the second sub-base part comprises a carbonized surface.

10. A chip on film for a display device, the chip on film comprising:
a base substrate;
a plurality of lead wires disposed on the base substrate; and
a driving chip connected to the plurality of lead wires,
wherein each of the plurality of lead wires includes:
a first lead part having a first thickness; and
a second lead part disposed between the first lead part and the driving chip and having a second thickness greater than the first thickness, the second lead part being connected to the driving chip,
wherein the first lead part and the second lead part comprise a same material,
wherein a surface of the base substrate includes a first base surface overlapping the first lead part, and a second base surface without overlapping the first lead part,
wherein the second base surface includes a first sub-base surface spaced apart from the first base surface, and a second sub-base surface located between the first sub-base surface and the first base surface,
wherein the second sub-base surface comprises surface irregularities, and
wherein a roughness of the second sub-base surface is greater than each of a roughness of the first base surface and a roughness of the first sub-base surface.

11. A display device comprising:
a display base substrate;
a first substrate including a pad disposed on the display base substrate; and
a chip on film connected to the pad,
wherein the chip on film includes:
a base substrate;
a plurality of lead wires disposed on the base substrate and connected to the pad; and
a driving chip connected to the lead wire, and
wherein each of the plurality of lead wires includes:
a first lead part having a first thickness; and
a second lead part disposed between the first lead part and the driving chip and having a second thickness greater than the first thickness, the second lead part being connected to the driving chip,
wherein the first lead part and the second lead part comprise a same material, and
wherein the base substrate includes a first base part overlapping the first lead part, and a second base part without overlapping the first lead part,
the second base part includes a first sub-base part spaced apart from the first base part, and a second sub-base part located between the first sub-base part and the first base part, and
a thickness of the second sub-base part is smaller than each of a thickness of the first base part and a thickness of the first sub-base part.

12. The display device of claim 11, wherein an end of the first lead part is aligned with an end of the base substrate.

13. The display device of claim 12, wherein the first lead part and a portion of the second lead part are connected to the pad.

14. The display device of claim 13, further comprising:
an anisotropic conductive film disposed between the plurality of lead wires and the pad,
wherein the plurality of lead wires are electrically connected to the pad through the anisotropic conductive film.

15. A method of fabricating a chip on film for a display device, the method comprising the steps of:
preparing a mother film in which a first portion corresponding to an inside of a cutting line of a rectangular frame shape, and a second portion corresponding to an outside of the cutting line are defined, the mother film including a driving chip mounted on the first portion, and a plurality of lead wires having an in-cutting line wire part disposed in the first portion and connected to the driving chip, and an out-cutting line wire part disposed in the second portion and connected to the in-cutting line wire part;

laser-processing a portion adjacent to the cutting line in the in-cutting line wire part;

forming a first lead part adjacent to the cutting line and having a first thickness, and a second lead part disposed between the first lead part and the driving chip and having a second thickness greater than the first thickness, and cutting the second portion along the cutting line, wherein the mother film includes a first base part overlapping the first lead part, and a second base part without overlapping the first lead part, the second base part includes a first sub-base part spaced apart from the first base part, and a second sub-base part located between the first sub-base part and the first base part, and a thickness of the second sub-base part is smaller than each of a thickness of the first base part and a thickness of the first sub-base part.

16. The method of claim 15, wherein in the step of preparing the mother film:

the out-cutting line wire part extends along a first direction from the in-cutting line wire part, and the plurality of lead wires are arranged along a second direction crossing the first direction.

17. The method of claim 16, wherein in the step of preparing the mother film:

the out-cutting line wire part includes:

a first out-cutting line wire part having a first width; and a second out-cutting line wire part having a second width greater than the first width.

* * * * *